United States Patent
Yamamoto et al.

(10) Patent No.: US 9,997,432 B2
(45) Date of Patent: Jun. 12, 2018

(54) SEMICONDUCTOR DEVICE AND ELECTRONIC COMPONENT USING THE SAME

(71) Applicant: DENSO CORPORATION, Kariya, Aichi-pref. (JP)

(72) Inventors: Takeo Yamamoto, Kariya (JP); Kazuhiko Sugiura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 15/514,555

(22) PCT Filed: Oct. 16, 2015

(86) PCT No.: PCT/JP2015/005230
§ 371 (c)(1),
(2) Date: Mar. 27, 2017

(87) PCT Pub. No.: WO2016/079921
PCT Pub. Date: May 26, 2016

(65) Prior Publication Data
US 2017/0213778 A1    Jul. 27, 2017

(30) Foreign Application Priority Data
Nov. 19, 2014  (JP) .................................. 2014-234573

(51) Int. Cl.
*H01L 23/34* (2006.01)
*H01L 23/373* (2006.01)
(Continued)

(52) U.S. Cl.
CPC ...... *H01L 23/3735* (2013.01); *H01L 21/4882* (2013.01); *H01L 23/3675* (2013.01); *H01L 23/3737* (2013.01)

(58) Field of Classification Search
CPC ............ H01L 23/3735; H01L 21/4882; H01L 23/3675; H01L 23/3737
(Continued)

(56) References Cited

U.S. PATENT DOCUMENTS 8,063,484 B2 * 11/2011  Kuroda ................. H01L 23/367
257/675
2010/0007013 A1  1/2010  Kuroda et al.
(Continued)

FOREIGN PATENT DOCUMENTS

JP  2008-159995 A  7/2008
JP  2009-043882 A  2/2009
JP  2011-199202 A  10/2011

*Primary Examiner* — Luan C Thai
(74) *Attorney, Agent, or Firm* — Posz Law Group, PLC

(57) ABSTRACT

A semiconductor device includes: a heat spreader; a semiconductor element on the heat spreader; and a connection member arranged between the heat spreader and the semiconductor element. The heat spreader is arranged in an order of the first heat spreader, the second heat spreader and the first heat spreader in one direction of a plane of the heat spreader. Each of the first and second heat spreaders includes multiple anisotropic heat conductive planes having a high heat conductivity. The anisotropic heat conductive plane of the first heat spreader is in parallel to both a stacking direction and a first direction perpendicular to the stacking direction. The anisotropic heat conductive plane of the second heat spreader is in parallel to both the stacking direction and a second direction perpendicular to the stacking direction. A projection region of the semiconductor element overlaps with the second heat spreader.

10 Claims, 6 Drawing Sheets

(51) Int. Cl.
*H01L 23/367* (2006.01)
*H01L 21/48* (2006.01)

(58) Field of Classification Search
USPC .......................................... 257/712
See application file for complete search history.

(56) References Cited

U.S. PATENT DOCUMENTS

2011/0303399 A1* 12/2011 Sakimichi ............... F28F 21/02
165/135
2012/0012995 A1 1/2012 Kuroda et al.

* cited by examiner

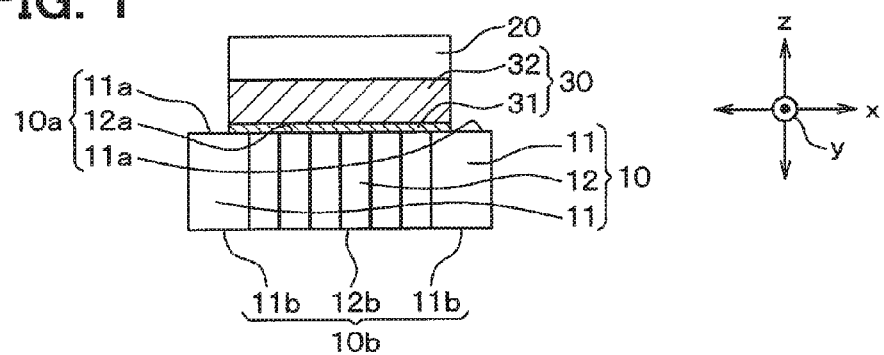
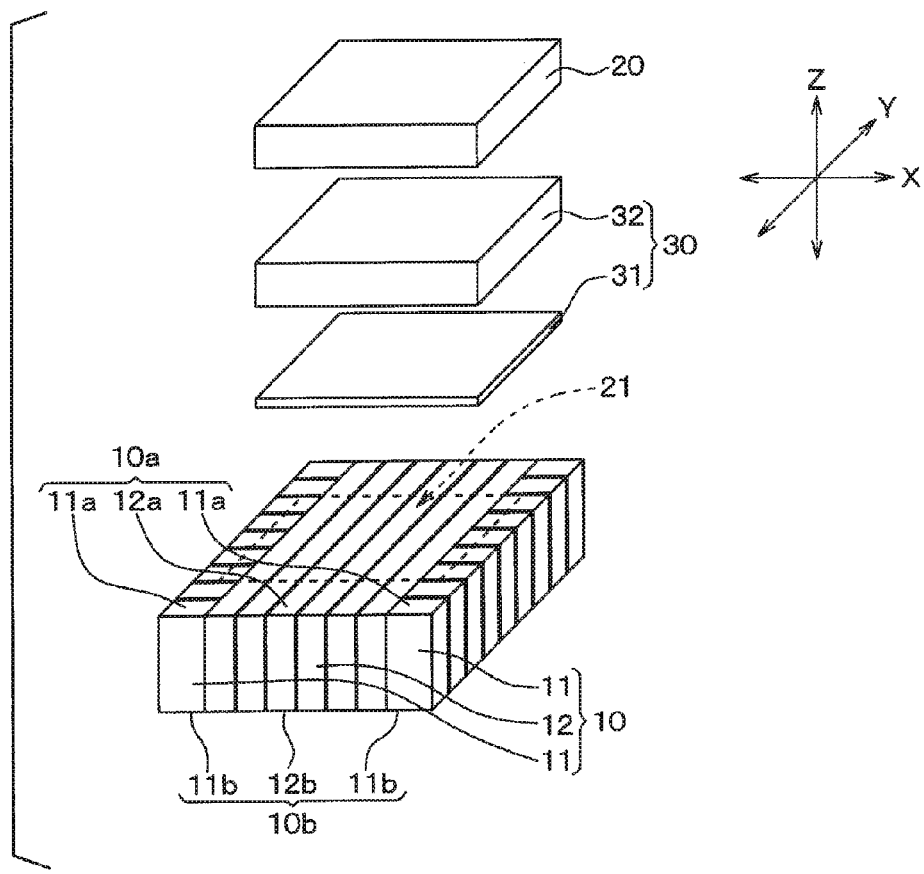

SEMICONDUCTOR DEVICE AND ELECTRONIC COMPONENT USING THE SAME

CROSS REFERENCE TO RELATED APPLICATIONS

This application is a U.S. national stage application of International Patent Application No. PCT/JP2015/005230 filed on Oct. 16, 2015 and is based on Japanese Patent Application No. 2014-234573 filed on Nov. 19, 2014, the disclosures of which are incorporated herein by reference.

TECHNICAL FIELD

The present disclosure relates to a semiconductor device in which a semiconductor element is mounted on a heat spreader, and an electronic component in which the semiconductor device is mounted on a heat sink.

BACKGROUND ART

Conventionally, for example, Patent Literature 1 teaches a semiconductor device in which a concavity is formed in a longitudinal direction anisotropic conductive sheet, a latitudinal direction anisotropic conductive sheet is arranged in the concavity so that a heat spreader is formed, and a semiconductor element is mounted on the latitudinal direction anisotropic conductive sheet in the heat spreader. Here, the longitudinal direction anisotropic conductive sheet is a sheet having a thermal conductivity in the longitudinal direction higher than the thermal conductivity in the latitudinal direction. The latitudinal direction anisotropic conductive sheet is a sheet having a thermal conductivity in the latitudinal direction higher than the thermal conductivity in the longitudinal direction.

When heat is generated at the semiconductor element in the above semiconductor device, the heat is transferred to the latitudinal direction anisotropic conductive sheet in the heat spreader at first. Then, when the heat is conducted to the latitudinal direction anisotropic conductive sheet along a latitudinal direction (i.e., a planar direction of the heat spreader), the heat is transferred to the longitudinal direction anisotropic conductive sheet arranged on a side of the concavity. After that, the heat is conducted to the longitudinal direction anisotropic conductive sheet along a longitudinal direction (i.e., a thickness direction of the heat spreader), and the heat is irradiated to an outside.

However, in the above semiconductor device, when the heat generated at the semiconductor element is transferred to the latitudinal direction anisotropic conductive sheet, the heat is conducted along the latitudinal direction of the latitudinal direction anisotropic conductive sheet. However, it is difficult to conduct the heat along the longitudinal direction of the latitudinal direction anisotropic conductive sheet. Accordingly, the above semiconductor device actually has a difficulty such that heat radiation may be reduced at a portion below the semiconductor element, i.e., a portion disposed on a bottom side of the concavity in the longitudinal direction anisotropic conductive sheet. Thus, there is a difficulty such that the heat radiation at the portion of the heat spreader opposite to the semiconductor element may be lower than the heat radiation at another portion around the portion, which is disposed below the bottom of the concavity, so that the heat generated at the semiconductor element is not effectively radiated.

Patent Literature

Patent Literature 1: JP-2008-159995

SUMMARY

It is an object of the present disclosure to provide a semiconductor device and an electronic component using the same with improved heat radiation.

According to a first aspect of the present disclosure, a semiconductor device includes: a heat spreader having one surface; a semiconductor element mounted on the one surface of the heat spreader; and a connection member arranged between the heat spreader and the semiconductor element, and thermally and electrically connecting the heat spreader and the semiconductor element. The heat spreader includes at least two first heat spreaders and at least one second heat spreader. The first heat spreaders and the second heat spreader are arranged in an order of the first heat spreader, the second heat spreader and the first heat spreader in one direction of a planar direction of the one surface of the heat spreader. Each of the first heat spreaders and the second heat spreader is configured to include a plurality of layers which are stacked and have a heat conductivity in a certain planar direction higher than a heat conductivity in a direction perpendicular to the certain planar direction. A surface of each of the first heat spreaders and the second heat spreader having a high heat conductivity is defined as an anisotropic heat conductive plane, and each of the first heat spreaders and the second heat spreader includes a plurality of anisotropic heat conductive planes. Each of the first heat spreaders is arranged that the plurality of anisotropic heat conductive planes is in parallel to both a stacking direction of the heat spreader and the semiconductor element and a first direction perpendicular to the stacking direction. The second heat spreader is arranged that the plurality of anisotropic heat conductive planes is in parallel to both the stacking direction and a second direction perpendicular to the stacking direction and different from the first direction. A region of the heat spreader provided by projecting the semiconductor element on the one surface of the heat spreader is defined as a projection region. The projection region overlaps with at least the second heat spreader.

In the above semiconductor device, the heat generated at the semiconductor element is effectively conducted to a portion of the other surface of the heat spreader opposite to the one surface and facing the semiconductor element, and the heat is discharged from the portion effectively. Thus, the heat radiation efficiency of the semiconductor device is improved.

According to a second aspect of the present disclosure, a semiconductor device includes: a heat spreader having one surface; a semiconductor element mounted on the one surface of the heat spreader; and a connection member arranged between the heat spreader and the semiconductor element, and thermally and electrically connecting the heat spreader and the semiconductor element. The heat spreader includes at least one first heat spreaders and at least one second heat spreader. The first heat spreader and the second heat spreader are arranged in an order of the first heat spreader and the second heat spreader in one direction of a planar direction of the one surface of the heat spreader. Each of the first heat spreader and the second heat spreader is configured to include a plurality of layers which are stacked and have a heat conductivity in a certain planar direction higher than a heat conductivity in a direction perpendicular to the certain planar direction. A surface of each of the first heat spreader and the second heat spreader having a high heat conductivity is defined as an anisotropic heat conductive plane, and each of the first heat spreader and the second heat spreader includes a plurality of anisotropic heat conductive planes. The first heat spreader is arranged that the plurality of anisotropic heat conductive planes is in parallel to both a stacking direction of the heat spreader and the semiconductor element and a first direction perpendicular to the stacking direction. The second heat spreader is arranged that the plurality of anisotropic heat conductive planes is in parallel to both the stacking direction and a second direction perpendicular to the stacking direction and different from the first direction. A region of the heat spreader provided by projecting the semiconductor element on the one surface of the heat spreader is defined as a projection region. The projection region overlaps with the first heat spreader and the second heat spreader.

In the above semiconductor device, the heat generated at the semiconductor element is effectively conducted to a portion of the other surface of the heat spreader opposite to the one surface and facing the semiconductor element, and the heat is discharged from the portion effectively. Thus, the heat radiation efficiency of the semiconductor device is improved.

According to a third aspect of the present disclosure, an electronic component includes: the semiconductor device according to the first aspect or the second aspect; and a heat sink arranged on an other surface of the heat spreader opposite to the one surface and thermally connected to the heat spreader.

In the above electronic component, since the electronic component is configured to include the heat sink using the semiconductor device, the heat radiation efficiency of the electronic component is improved.

BRIEF DESCRIPTION OF DRAWINGS

The above and other objects, features and advantages of the present disclosure will become more apparent from the following detailed description made with reference to the accompanying drawings. In the drawings:

FIG. 1 is a cross sectional view of a semiconductor device according to a first embodiment of the present disclosure;

FIG. 2 is an exploded perspective view of the semiconductor device shown in FIG. 1;

DETAILED DESCRIPTION

Figure 3:
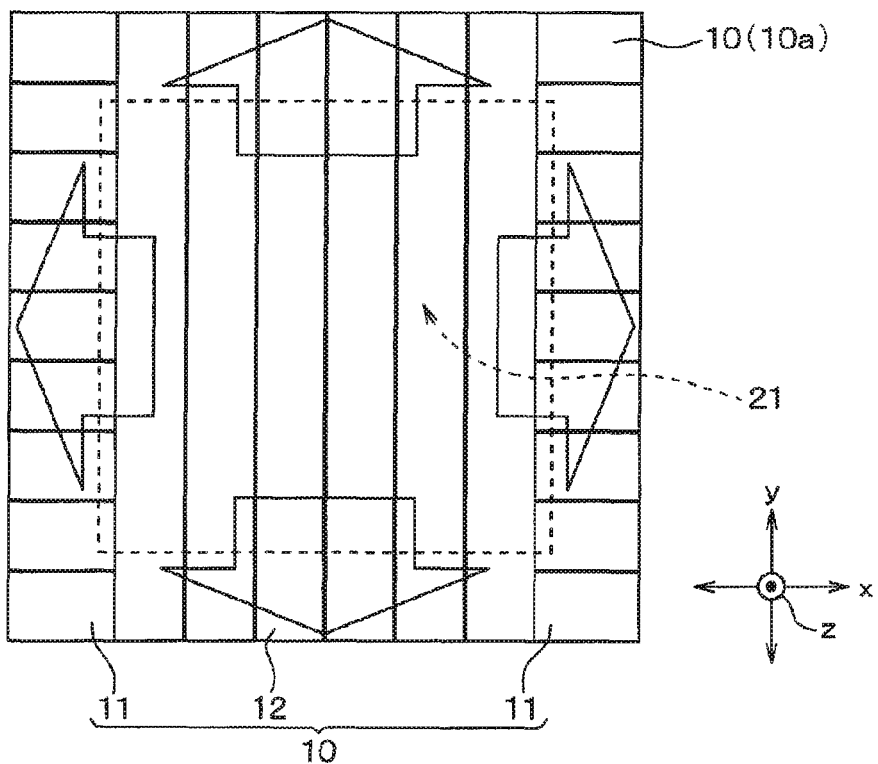
FIG. 3 is a schematic diagram showing a transfer route of heat in a heat spreader show in FIG. 1.

Embodiments of the present disclosure will be explained with respect to drawings. Here, the same reference number is assigned to the same or equivalent part in each embodiment in the following explanation.

First Embodiment

A first embodiment of the present disclosure will be explained with reference to drawings. In a semiconductor device according to the present embodiment, as shown in FIGS. 1 and 2, a semiconductor element 20 is mounted on a surface 10a of a heat spreader 10 via a connection member 30. Here, in FIGS. 1 and 2, a stacking direction (i.e., an up-down direction of a sheet of FIG. 1) of the heat spreader 10, the semiconductor element 20 and the connection member 30 is defined as a z direction. A first direction (i.e., a right-left direction of a sheet of FIG. 1) perpendicular to the z direction is defined as a x direction, and a second direction (i.e., a depth direction of a sheet of FIG. 1) perpendicular to the z direction and the x direction is defined as y direction.

In the present embodiment, the heat spreader 10 includes two first heat spreaders 11 having a rectangular parallelepiped shape with one surface 11a and the other surface 11b and second heat spreader 12 having a rectangular parallelepiped shape with one surface 12a and the other surface 12b. The first and second heat spreaders 11, 12 are arranged along the x direction in an order of the first heat spreader 11, the second heat spreader 12 and the first heat spreader 11. Specifically, the second heat spreader 12 is arranged between two first heat spreaders 11.

Further, the length of the first heat spreader 11 in each of the z direction and the y direction is equal to the second heat spreader 12. The length of the first heat spreader 11 in the x direction is shorter than the length of the second heat spreader 12 in the x direction. The first and second heat spreaders 11, 12 are bonded to each other by a brazing method or the like so that the one surface 10a of the heat spreader 10 is provided by the one surface 11a of the first heat spreader and the one surface 12a of the second heat spreader 12, and the other surface 10b of the heat spreader 10 is provided by the other surface 11b of the first heat spreader and the other surface 12b of the second heat spreader 12. Here, in the present embodiment, each side of the heat spreader 10 perpendicular to the one surface 10a is in parallel to the xz plane or the yz plane.

Here, the first and second heat spreaders 11, 12 will be explained in detail. In the present embodiment, the first and second heat spreaders 11, 12 are made of highly oriented graphite in which black lead is stacked in a layered structure. Accordingly, the thermal conductivity of the first and second heat spreaders 11, 12 along a planar direction of each layer is higher than the thermal conductivity along a stacking direction of the layers. Thus, the first and second heat spreaders 11, 12 are anisotropic thermal conductor having the high thermal conductivity along a certain planar direction. Although not specified, for example, the thermal conductivity of the first and second heat spreaders 11, 12 with respect to the planar direction of the layers is 1700 [W/m·K], the thermal conductivity with respect to the stacking direction of the layers is 7 [W/m·K], the electric resistance with respect to the planar direction of the layers is $5 \times 10^{-4}$ [Ω·cm], and the electric resistance with respect to the stacking direction of 0.6 [Ω·cm]. Here, for example, copper used as heat radiation material or heat conductor in general has the thermal conductivity of 400 [W/m·K] and the electric resistance of $1.7 \times 10^{-6}$ [Ω·cm].

When a surface of the first heat spreader 11 having the high thermal conductivity (i.e., the surface of each layer providing the first heat spreader 11) is defined as anisotropic heat conductive plane, the first heat spreader 11 is arranged such that the anisotropic heat conductive plane is in parallel to the z direction and the x direction. Thus, the first heat spreader 11 is arranged such that the anisotropic heat conductive plane is in parallel to the one surface 11a (i.e., the xy plane) and a surface (i.e., the yz plane) perpendicular to the one surface. Specifically, the first heat spreader 11 is arranged such that the anisotropic heat conductive plane is in parallel to the xz plane.

Further, when a surface of the second heat spreader 12 having the high thermal conductivity (i.e., the surface of each layer providing the second heat spreader 12) is defined as anisotropic heat conductive plane, the second heat spreader 12 is arranged such that the anisotropic heat conductive plane is in parallel to the z direction and the y direction perpendicular to the z direction. Thus, the second heat spreader 12 is arranged such that the anisotropic heat conductive plane is in parallel to the one surface 11a (i.e., the xy plane) and a surface (i.e., the xz plane) perpendicular to the one surface. Specifically, the second heat spreader 12 is arranged such that the anisotropic heat conductive plane is in parallel to the yz plane. Thus, in the present embodiment, the first heat spreader 11 and the second heat spreader 12 are arranged such that the anisotropic heat conductive plane of the first heat spreader 11 is perpendicular to the second heat spreader 12.

In the present embodiment, the semiconductor element 20 is a device in which a diode element, a MOSFET or the like is formed on a silicon carbide (SiC) substrate that provides a low loss and a high withstand voltage. As shown in FIG. 2, the semiconductor element 20 is arranged such that the center of a projection region 21 overlaps with almost a center of the one surface 10a of the heat spreader 11 when the semiconductor element 20 is projected on the one surface 10a of the heat spreader 10. The semiconductor element 20 has a size such that the projection region 21 straddles both of the second heat spreader 12 and two first heat spreaders 11 which sandwich the second heat spreader 12. Specifically, the length of each of the first and second heat spreaders 11, 12 in the x direction is appropriately adjusted so that the projection region 21 straddles the second heat spreader 12 and two first heat spreaders 11. Here, in FIG. 2, the projection region 21 provided by projecting the semiconductor element 20 over the one surface 10a of the heat spreader 10 is shown as a dotted line.

The connection member 30 is arranged between the heat spreader 10 and the semiconductor element 10, and the connection member 30 couples thermally and electrically the heat spreader 10 and the semiconductor element 20. In the present embodiment, the connection member 30 includes a first connection member 31 and a second connection member 32. The first connection member 30 is disposed on a heat spreader 10 side. Although not specified, the first connection member 31 may be a metallic film, a plating film or the like made of Cu, Al, Mo, Ni, Au, Ag or the like. The second connection member 32 is made of Sn, Sn solder, Ag, Cu, Zn, Pb or the like.

Here, the connection member 30 is arranged on a whole surface of a part of the semiconductor element 20 disposed on the heat spreader 10 side. Similar to the projection region 21 of the semiconductor element 20, the connection member 30 is arranged such that the connection member 30 straddles both of the second heat spreader 12 and two first heat spreaders 11 which sandwich the second heat spreader 12. Thus, the semiconductor element 20 couples thermally and electrically two first heat spreaders 11 and the second heat spreader 12.

The above structure is the semiconductor device according to the present embodiment. Next, in the semiconductor device, the flow of heat generated in the semiconductor element 20 will be explained with reference to FIG. 3. FIG. 3 is a plan view of the heat spreader 10, and the projection region 21 which is obtained by projecting the semiconductor element 20 on the one surface 10a of the heat spreader 10 is shown as a dotted line, and the flow of heat is shown as an arrow.

When the heat is generated in the semiconductor element 20, the heat is conducted to the heat spreader 10 via the connection member 30. In the present embodiment, as described above, the projection region 21 of the semiconductor element 20 straddles the second heat spreader 12 and two first heat spreaders 11 so that the semiconductor element 20 couples thermally the second heat spreader 12 and two first heat spreaders 11. Accordingly, the heat generated in the semiconductor element 20 is conducted to the second heat spreader 12 and two first heat spreaders 11.

The heat conducted to the first heat spreader 11 is transferred along the anisotropic heat conductive plane (i.e., the xz plane). Similarly, the heat conducted to the second heat spreader 12 is transferred along the anisotropic heat conductive plane (i.e., the yz plane). Thus, in the semiconductor device according to the present embodiment, when the heat is generated at the semiconductor element 20, the heat is conducted along the anisotropic heat conductive plane of each of the first and second heat spreaders 11, 12, so that the heat is rapidly transferred to a portion and a surrounding portion of the portion on the other surface 10b of the heat spreader 10, the portion being opposed to the semiconductor element 20. Accordingly, the heat is effectively discharged from the other surface 10b of the heat spreader 10.

Figure 4:
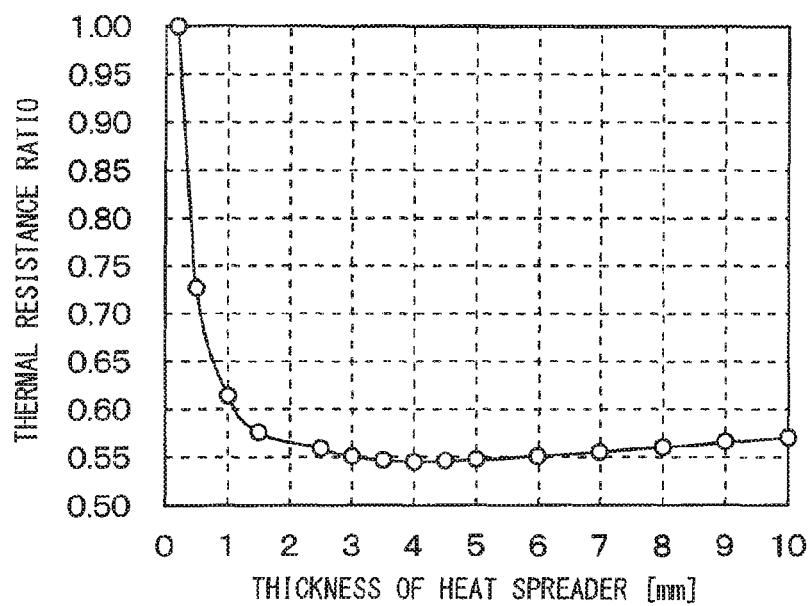
FIG. 4 is a diagram showing a relationship between a thickness of the heat spreader and a thermal resistance ratio.

Here, the length (i.e., the thickness) of the heat spreader 10 in the z direction will be explained with reference to FIG. 4. Here, in FIG. 4, the heat spreader 10 is made of graphite, and the thermal resistance is a standard when the thickness is 0.2 mm (i.e., the thermal resistance ratio is 1 when the thickness is 0.2 mm).

As described above, the heat conductivity of the heat spreader 10 in the z direction according to the present embodiment is set to be high (i.e., the thermal resistance is set to be low). As shown in FIG. 4, the thermal resistance of the heat spreader 10 is minimized when the thickness is 4 mm. This is because the influence of the resistance of the heat spreader 10 itself becomes large when the thickness is larger than 4 mm (i.e., when the length in the z direction becomes long). Further, as the thickness becomes large, the stress of the heat spreader 10 applied to the connection member 30 increases, and the manufacturing cost also increases. Accordingly, in the heat spreader 10 according to the present embodiment, the thickness is set to be equal to or smaller than 4 mm so that the thermal resistance is relatively small, and the stress with respect to the connection member 30 is also small.

As explained above, in the present embodiment, the heat spreader 10 includes the first heat spreader 11 having the anisotropic heat conductive plane in parallel to the xz plane and the second heat spreader 12 having the anisotropic heat conductive plane in parallel to the yz plane. The semiconductor element 20 is arranged such that the projection region 21 straddles the second heat spreader 12 and two first heat spreaders 11 so that the semiconductor element 20 is directly and thermally connected to the second heat spreader 12 and two first heat spreaders 11. Accordingly, the heat generated at the semiconductor element 20 is effectively conducted to each of the x direction, the y direction and the z direction.

Thus, the heat is effectively discharged from the portion of the other surface 11b of the heat spreader 10 opposing to the semiconductor element 20 (i.e., the portion disposed under the semiconductor element 20).

Further, the anisotropic heat conductive planes of the first and second heat spreaders 11, 12 are perpendicular to each other. Accordingly, the heat generated at the semiconductor element 20 is homogeneously transferred inside of the heat spreader 10.

Furthermore, the thickness of the heat spreader 10 is equal to or smaller than 4 mm. Accordingly, the thermal resistance of the heat spreader 10 is reduced, and further, the stress applied to the connection member 30 is also reduced.

Second Embodiment

A second embodiment of the present disclosure will be explained as follows. In the present embodiment, the conductive member is added to the second heat spreader 12, compared with the first embodiment. Other features are similar to the first embodiment, and therefore, the other features are not explained.

Figure 5:
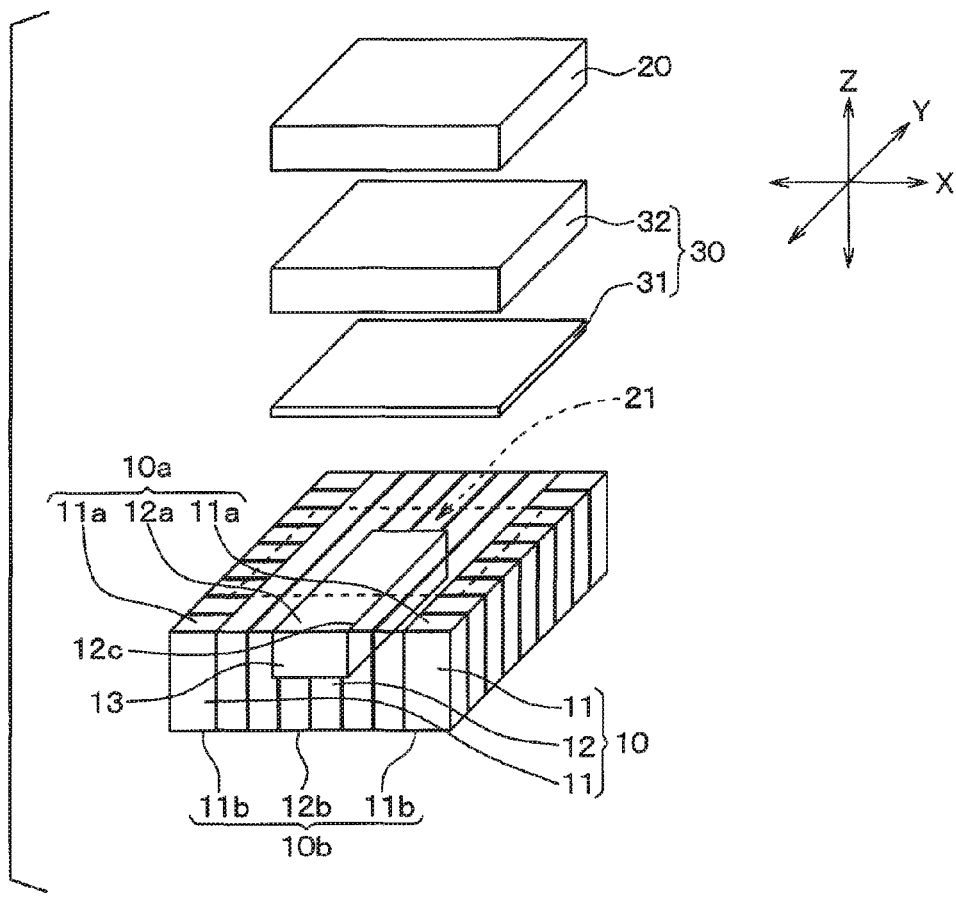
FIG. 5 is an exploded perspective view of a semiconductor device according to a second embodiment of the present disclosure.

In the present embodiment, as shown in FIG. 5, the conductive member 13 made of metal such as Cu and Al having the electric resistivity lower than the heat spreader 10 (i.e., made of graphite) is arranged in the second heat spreader 12.

Specifically, a concavity 12c is formed on a one surface 10a side of the heat spreader 10 including the projection region 21 of the second heat spreader 12, and the conductive member 13 is arranged in the concavity 12c. Thus, a part of the one surface 10a of the heat spreader 10 overlapping with the projection region 21 is provided by the conductive member 13.

The second heat spreader 12 and the conductive member 13 are bonded to each other by the brazing method or the like. Further, in FIG. 5, the concavity 12c does not penetrate the second heat spreader 12. Alternatively, the concavity 12c may penetrate the second heat spreader 12.

In the above feature, the conductive member 13 having the electric resistivity lower than the second heat spreader 12 is arranged in the second heat spreader 12. Accordingly, the current path is secured in the heat spreader 10, so that a power device for flowing large current may be used as the semiconductor element 20.

Third Embodiment

A third embodiment of the present disclosure will be explained. In the present embodiment, the shape of each of the first and second heat spreaders 11, 12 is changed compared with the first embodiment. Other features are similar to the first embodiment, and therefore, the other features are not explained.

Figure 6:
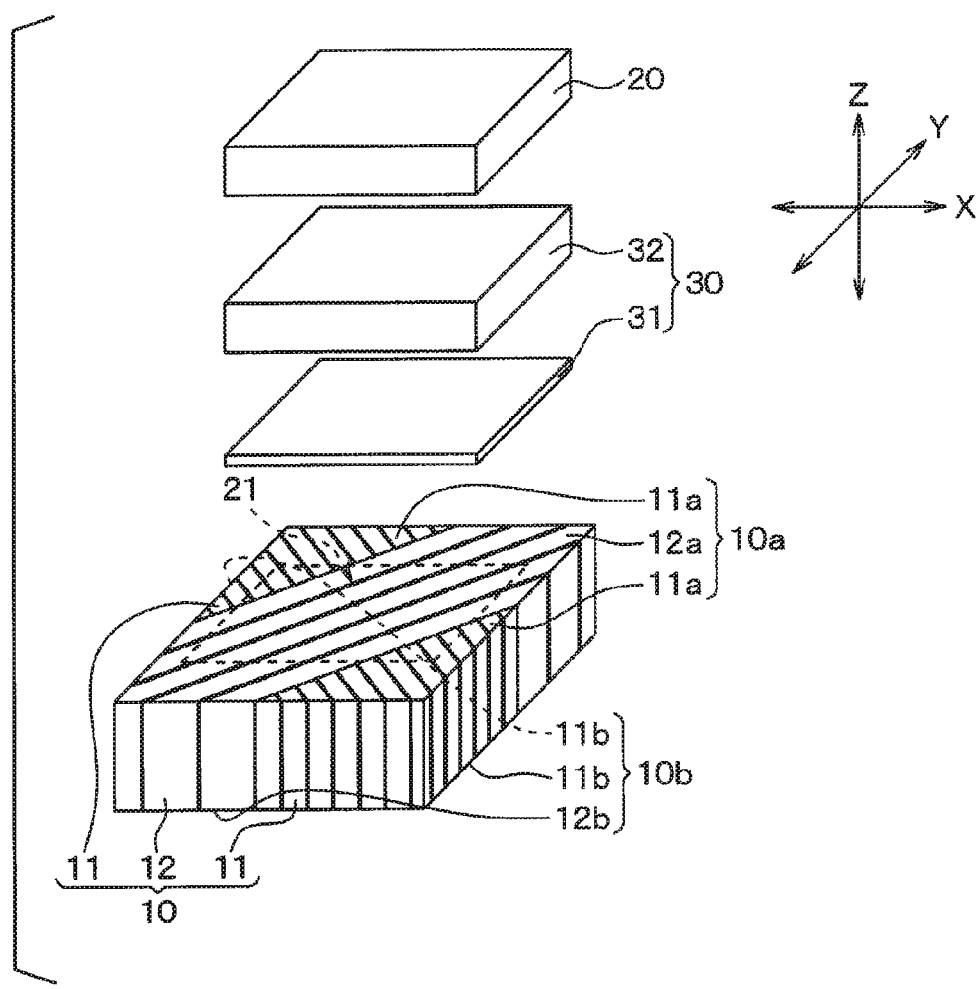
FIG. 6 is an exploded perspective view of a semiconductor device according to a third embodiment of the present disclosure.

In the present embodiment, as shown in FIG. 6, the first heat spreader 11 has a triangular prism shape, and the second heat spreader 12 has a hexagonal prism shape. The anisotropic heat conductive plane of the first heat spreader 11 is tilted by 45 degrees with respect to the xz plane and the yz plane. Similarly, the anisotropic heat conductive plane of the second heat spreader 12 is tilted by 45 degrees with respect to the xz plane and the yz plane.

Thus, the anisotropic heat conductive plane of each of the first and second heat spreaders 11, 12 is not in parallel to each side of the heat spreader 10 perpendicular to the one surface 10a. Here, in the present embodiment, the anisotropic heat conductive planes of the first and second heat spreaders 11, 12 are perpendicular to each other, and the heat spreader 10 is a rectangular parallelepiped shape.

Thus, the present disclosure is applied to the semiconductor device in which the anisotropic heat conductive plane of each of the first and second heat spreaders 11, 12 is not in parallel to each side of the heat spreader 10 perpendicular to the one surface 10a. The similar effects of the first embodiment are obtained.

Fourth Embodiment

A fourth embodiment of the present disclosure will be explained. In the present embodiment, the number of the first heat spreader 11 is one compared with the first embodiment. Other features are similar to the first embodiment, and therefore, the other features are not explained.

Figure 7:
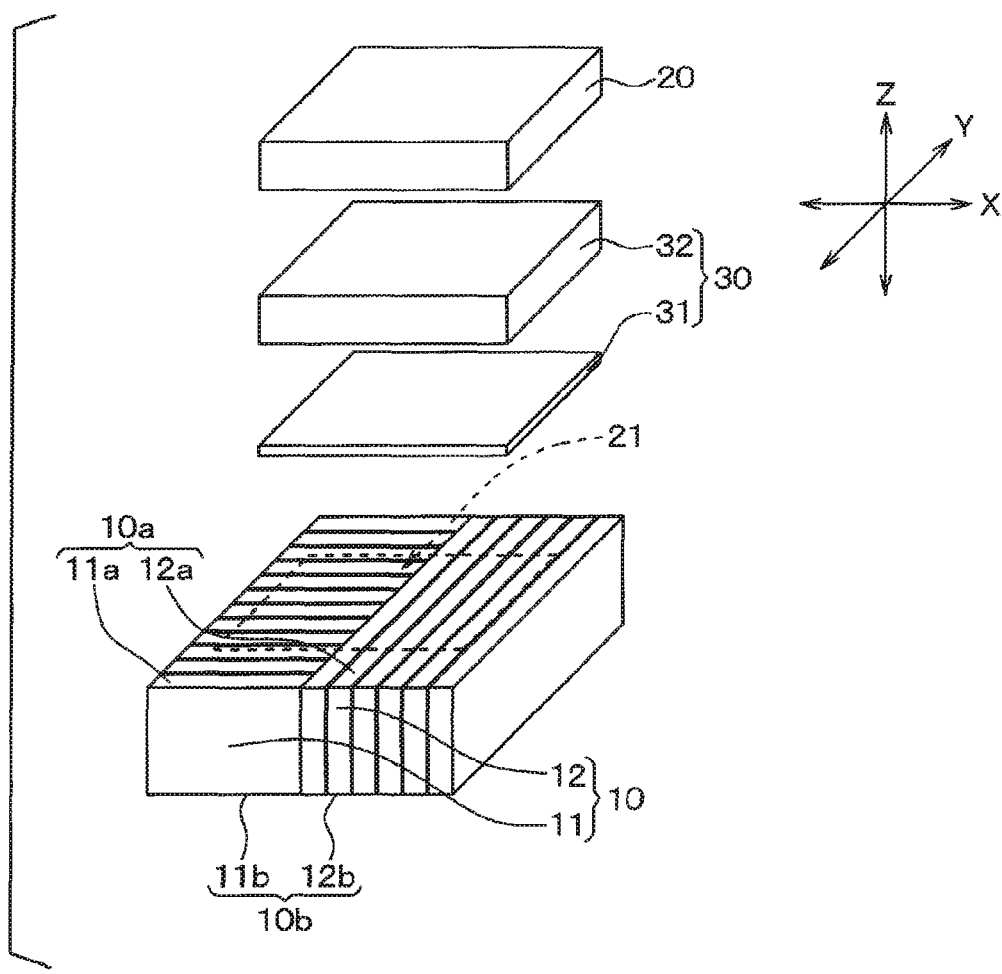
FIG. 7 is an exploded perspective view of a semiconductor device according to a fourth embodiment of the present disclosure.

In the present embodiment, as shown in FIG. 7, the heat spreader 10 includes one first heat spreader 11 and one second heat spreader 12. The first heat spreader 11 and the second heat spreader 12 are connected to each other via the brazing method or the like so that the heat spreader 10 is provided. The heat spreader 10 has a rectangular parallelepiped shape. Here, in the present embodiment, the anisotropic heat conductive planes of the first and second heat spreaders 11, 12 are perpendicular to each other.

As shown in FIG. 7, the semiconductor element 20 is arranged such that the center of the projection region 21 almost coincides with the center of the one surface 10a of the heat spreader 10 when the semiconductor element 20 is projected on the one surface 10a of the heat spreader 10. Thus, the semiconductor element 20 is arranged such that the projection region 21 straddles the second heat spreader 12 and the first heat spreaders 11. Here, in FIG. 7, the projection region 21 provided by projecting the semiconductor element 20 over the one surface 10a of the heat spreader 10 is shown as a dotted line.

Figure 8:
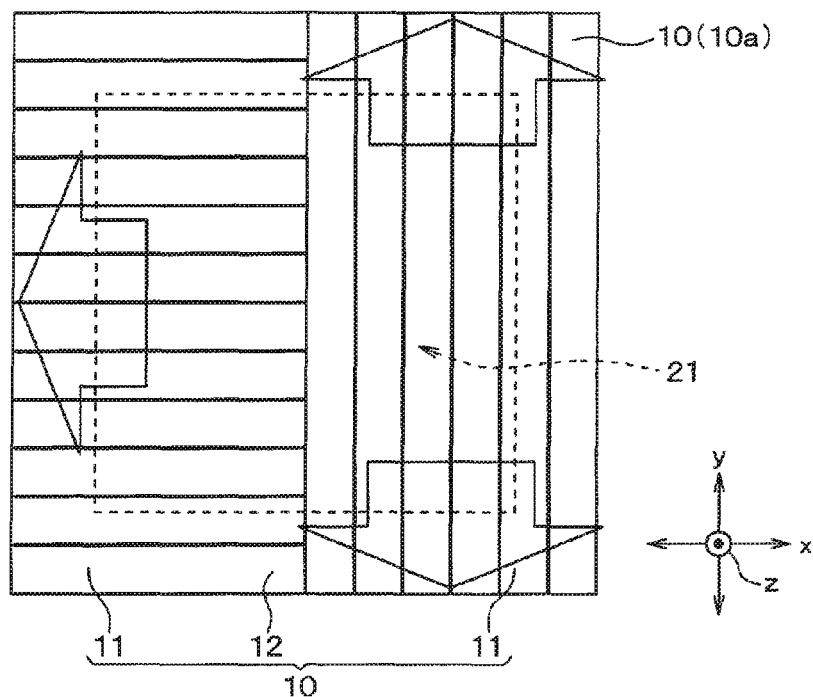
FIG. 8 is a schematic diagram showing a transfer route of heat in a heat spreader show in FIG. 7.

The construction of the semiconductor device according to the present embodiment is described above. Next, in the semiconductor device, the flow of heat generated at the semiconductor element 20 will be explained with respect to FIG. 8. FIG. 8 is a plan view of the heat spreader 10. In FIG. 8, the projection region 21 provided by projecting the semiconductor element 20 over the one surface 10a of the heat spreader 10 is shown as a dotted line, and the flow of the heat is shown as an arrow.

When the heat is generated at the semiconductor element 20, the heat is conducted to the heat spreader 10 via the connection member 30. In the present embodiment, as described above, the projection region 21 of the semiconductor element 20 straddles the first and second heat spreaders 11, 12. Thus, the semiconductor element 20 is directly and thermally connected to the first heat spreader 11 and the second heat spreader 12. Accordingly, the heat generated at the semiconductor element 20 is transferred to each of the first heat spreader 11 and the second heat spreader 12.

The heat transferred to the first heat spreader 11 is conducted along the anisotropic heat conductive plane (i.e., the xz plane). Similarly, the heat transferred to the second heat spreader 12 is conducted along the anisotropic heat conductive plane (i.e., the yz plane). Thus, when the heat is generated at the semiconductor element 20, the heat is conducted along the anisotropic heat conductive plane of each of the first and second heat spreaders 11, 12, so that the heat is rapidly conducted to the portion and the periphery portion around the portion of the other surface 10b of the heat spreader 10 opposing the semiconductor element 20.

Accordingly, the heat is effectively discharged from the other surface 10b of the heat spreader 10.

Thus, even when the semiconductor device is configured to include the one first heat spreader 11 and the one second heat spreader 12, similar effects as the first embodiment are obtained.

Fifth Embodiment

A fifth embodiment of the present disclosure will be explained as follows. In the present embodiment, an electronic component is constructed using the semiconductor device according to the first embodiment. Other features are similar to the first embodiment, and therefore, the other features are not explained.

Figure 9:
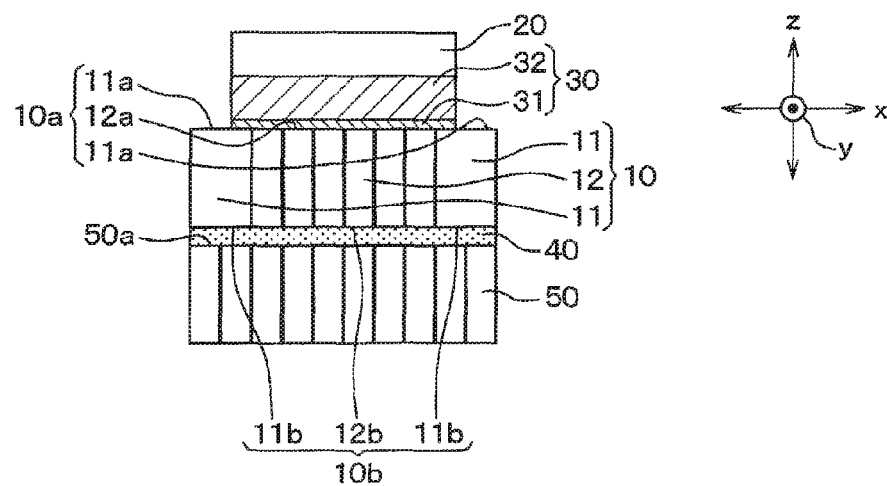
FIG. 9 is a cross sectional view of a semiconductor element according to a fifth embodiment of the present disclosure.

In the present embodiment, as shown in FIG. 9, a heat sink 50 is mounted on the other surface 10b of the heat spreader 10 via an insulation member 40, so that the electronic component is formed. Thus, the semiconductor device is mounted on one surface 50a of the heat sink 50 via the insulation member 40.

The insulation member 40 is made of $Al_2O_3$, $Si_3N_4$, AlN, other ceramic substrate, an insulation sheet or the like.

The heat sink 50 is made of highly oriented graphite in which black lead is stacked in a layered structure, similar to the first and second heat spreaders 11, 12. Thus, similar to the first and second heat spreaders 11, 12, a thermal conductivity in the planar direction of the layer is higher than the thermal conductivity in the stacking direction of the layer. In the present embodiment, when a surface of the heat sink 50 having the high thermal conductivity (i.e., the surface of each layer providing the heat sink 50) is defined as anisotropic heat conductive plane, the heat sink 50 is arranged such that the anisotropic heat conductive plane is in parallel to the z direction. Here, in FIG. 9, the anisotropic heat conductive plane of the heat sink 50 is in parallel to the yz plane. Alternatively, the anisotropic heat conductive plane may be in parallel to the xz plane.

As described above, the electronic component may be formed using the semiconductor device in the present disclosure. In the present embodiment, the heat sink 50 is arranged such that the anisotropic heat conductive plane is in parallel to the z direction. Accordingly, in the present embodiment, the heat is rapidly conducted to the surface of the heat sink 50 opposite to the semiconductor element 20 side.

Here, when the heat sink 50 is made of copper, which is conventional material, the heat is conducted from the heat spreader 10 to the heat sink 50, and then, the heat radially expands in the copper from a part of the heat sink 50 to which the heat is conducted. Accordingly, when the heat sink 50 is made of copper, in general, a planar shape of the heat sink 50 is designed to be larger than the planar shape of the heat spreader 10 in order to improve a heat radiation efficiency. However, in the present embodiment, since the thermal conductivity of the anisotropic heat conductive plane in the heat sink 50 is higher than copper, the heat radiation is effectively performed even when the planar shape of the heat sink 50 has the same size of the planar shape of the heat spreader 10. Accordingly, the electronic component according to the present embodiment provides to minimize the size.

Other Embodiments

For example, in the above embodiments, the anisotropic heat conductive planes of the first and second heat spreaders 11, 12 are perpendicular to each other. Alternatively, the anisotropic heat conductive planes of the first and second heat spreaders 11, 12 may not be perpendicular to each other. Specifically, when the anisotropic heat conductive planes of the first and second heat spreaders 11, 12 are perpendicular to the one surface 10a of the heat spreader 10, and are not in parallel to each other, the effects of the present disclosure are obtained.

In the above embodiments, for example, in FIG. 2 or the like, the first and second connection members 31 are shown to have the same size of the semiconductor element 20. Alternatively, the first and second connection members 31 may have a different size from the semiconductor element 20.

In the above embodiments, the first and second heat spreaders 11, 12 may be made of carbon nano-tube or the like.

In the above embodiments, the semiconductor element 20 may be an element in which a diode, a MOSFET and the like are formed on a silicon substrate.

In the above embodiments, the first and second connection members 31, 32 may be provided by one metallic film or the like.

In the first to third embodiments, the projection region 21 of the semiconductor element 20 straddles two first heat spreaders 11 and the second heat spreader 12. Alternatively, the projection region 21 may not straddle two first heat spreaders 11. Specifically, the projection region 21 may be disposed within the second heat spreader 12. In these semiconductor devices, the heat is effectively discharged from the portion of the other surface 11b of the heat spreader 10 facing the semiconductor element 20. Further, the second heat spreader 12 has a low heat conductivity along a direction perpendicular to the anisotropic heat conductive plane. However, after the heat is conducted in the direction perpendicular to the anisotropic heat conductive plane, the heat is rapidly transferred via the first heat spreader 11.

In the second embodiment, the concavity 12c is formed on the one surface 10a side of the heat spreader 10 including the projection region 21, and the conductive member 13 is arranged in the concavity 12c. Alternatively, the following feature may be applied.

For example, the concavity 12c may be formed on a portion of the one surface 10a side of the heat spreader 10 other than the projection region 21. The conductive member 13 is arranged in the concavity 12c. Alternatively, the conductive member 13 may be arranged on a whole of the portion of the one surface 10a side of the heat spreader 10 which overlaps with the projection region 21. Specifically, the conductive member 13 may be arranged on the one surface 10a of the heat spreader 10 so as to coincide with the projection region 21. In this case, since the current concentrates mainly at a portion on the one surface 10a side of the heat spreader in the projection region 21 (i.e., below the semiconductor element 20), the whole of the portion is provided by the conductive member 13 so that the current path is much easily secured and the heat generation at the portion is restricted. Here, when the whole of the portion of the one surface 10a side of the heat spreader 10 which overlaps with the projection region 21 is provided by the conductive member 13, it is preferable that the conductive member 13 is arranged at only the portion overlapping with the projection region 21. When the conductive member 13 is arranged at the whole of the portion overlapping with the projection region 21 and a peripheral portion around the projection region 21, the heat conductivity of the heat spreader 10 may be too much reduced.

Alternatively, the concavity 12c may be formed on a side of the heat spreader 10 opposite to the one surface 10a, and the conductive member 13 may be arranged in the concavity 12c. Thus, a part of the other surface 12b of the heat spreader 10 may be provided by the conductive member 13.

Alternatively, a plurality of conductive members 13 may be arranged. In this case, multiple conductive members 13 may be arranged on the one surface 10a side of the heat spreader 10. Alternatively, multiple conductive members 13 may be arranged on the other surface 10a side of the heat spreader 10. Alternatively, multiple conductive members 13 may be arranged on each of the one surface 10a side and the other surface 10b side of the heat spreader 10.

In the fourth embodiment, the planar shape of each of the insulation member 40 and the heat sink 50 may be larger than the planar shape of the heat spreader 10. The size of the planar shape may be changeable appropriately. Alternatively, the heat sink 50 may be made of metallic material such as Cu and Al.

Alternatively, the above embodiments may be combined appropriately. For example, the second embodiment may be combined with the third to fifth embodiments so that the conductive member 13 is arranged. Alternatively, the third embodiment or the fourth embodiment may be combined with the fifth embodiment so that the electronic component includes the heat sink 50. Alternatively, combinations of the above embodiments may be further combined with each other.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
a heat spreader having one surface;
a semiconductor element mounted on the one surface of the heat spreader; and
a connection member arranged between the heat spreader and the semiconductor element, and thermally and electrically connecting the heat spreader and the semiconductor element, wherein:
the heat spreader includes at least two first heat spreaders and at least one second heat spreader;
the first heat spreaders and the second heat spreader are arranged in an order of the first heat spreader, the second heat spreader and the first heat spreader in one direction of a planar direction of the one surface of the heat spreader;
each of the first heat spreaders and the second heat spreader is configured to include a plurality of layers which are stacked and have a heat conductivity in a certain planar direction higher than a heat conductivity in a direction perpendicular to the certain planar direction;
a surface of each of the first heat spreaders and the second heat spreader having a high heat conductivity is defined as an anisotropic heat conductive plane, and each of the first heat spreaders and the second heat spreader includes a plurality of anisotropic heat conductive planes;
each of the first heat spreaders is arranged that the plurality of anisotropic heat conductive planes is in parallel to both a stacking direction of the heat spreader and the semiconductor element and a first direction perpendicular to the stacking direction;
the second heat spreader is arranged that the plurality of anisotropic heat conductive planes is in parallel to both the stacking direction and a second direction perpendicular to the stacking direction and different from the first direction;
a region of the heat spreader provided by projecting the semiconductor element on the one surface of the heat spreader is defined as a projection region;
the projection region overlaps with at least the second heat spreader;
each of the first heat spreader and the second heat spreader is made of graphite; and
the heat spreader has a plate shape, and a length of the heat spreader in the stacking direction is equal to or smaller than 4 mm.

2. The semiconductor device according to claim 1, wherein:
the projection region overlaps with the second heat spreader and two first heat spreaders sandwiching the second heat spreader.

3. A semiconductor device comprising:
a heat spreader having one surface;
a semiconductor element mounted on the one surface of the heat spreader; and
a connection member arranged between the heat spreader and the semiconductor element, and thermally and electrically connecting the heat spreader and the semiconductor element, wherein:
the heat spreader includes at least one first heat spreaders and at least one second heat spreader;
the first heat spreader and the second heat spreader are arranged in an order of the first heat spreader and the second heat spreader in one direction of a planar direction of the one surface of the heat spreader;
each of the first heat spreader and the second heat spreader is configured to include a plurality of layers which are stacked and have a heat conductivity in a certain planar direction higher than a heat conductivity in a direction perpendicular to the certain planar direction;
a surface of each of the first heat spreader and the second heat spreader having a high heat conductivity is defined as an anisotropic heat conductive plane, and each of the first heat spreader and the second heat spreader includes a plurality of anisotropic heat conductive planes;
the first heat spreader is arranged that the plurality of anisotropic heat conductive planes is in parallel to both a stacking direction of the heat spreader and the semiconductor element and a first direction perpendicular to the stacking direction;
the second heat spreader is arranged that the plurality of anisotropic heat conductive planes is in parallel to both the stacking direction and a second direction perpendicular to the stacking direction and different from the first direction;
a region of the heat spreader provided by projecting the semiconductor element on the one surface of the heat spreader is defined as a projection region;
the projection region overlaps with the first heat spreader and the second heat spreader;
each of the first heat spreader and the second heat spreader is made of graphite; and the heat spreader has a plate shape, and a length of the heat spreader in the stacking direction is equal to or smaller than 4 mm.

4. The semiconductor device according to claim 1, wherein:
the plurality of anisotropic heat conductive planes of the first heat spreader is perpendicular to the plurality of anisotropic heat conductive planes of the second heat spreader.

5. The semiconductor device according to claim 1, wherein:
the heat spreader further includes a conductive member having an electric resistivity lower than the plurality of layers.

6. The semiconductor device according to claim 5, wherein:
the conductive member is arranged on the one surface of the heat spreader; and
at least a part of the conductive member is disposed within the projection region on a plane of the heat spreader perpendicular to the stacking direction.

7. The semiconductor device according to claim 5, wherein:
the conductive member is arranged on the one surface of the heat spreader; and
the conductive member overlaps with the projection region on a plane of the heat spreader perpendicular to the stacking direction.

8. The semiconductor device according to claim 1, wherein:
the semiconductor element is configured to include a silicon carbide semiconductor substrate.

9. An electronic component comprising:
the semiconductor device according to claim 1; and
a heat sink arranged on another surface of the heat spreader opposite to the one surface and thermally connected to the heat spreader.

10. The electronic component according to claim 9, wherein:
the heat sink is configured to include a plurality of layers which are stacked and have a heat conductivity in a certain planar direction higher than a heat conductivity in a direction perpendicular to the certain planar direction;
a surface of the heat sink having a high heat conductivity is defined as an anisotropic heat conductive plane, and the heat sink includes a plurality of anisotropic heat conductive planes;
the plurality of anisotropic heat conductive planes of the heat sink is in parallel to a stacking direction of the heat sink and the semiconductor element.

* * * * *